United States Patent
Apalkov et al.

(10) Patent No.: US 9,142,758 B2
(45) Date of Patent: *Sep. 22, 2015

(54) METHOD AND SYSTEM FOR PROVIDING A MAGNETIC JUNCTION CONFIGURED FOR PRECESSIONAL SWITCHING USING A BIAS STRUCTURE

(75) Inventors: Dmytro Apalkov, San Jose, CA (US); Xueti Tang, San Jose, CA (US); Mohamad Towfik Krounbi, San Jose, CA (US); Vladimir Nikitin, Campbell, CA (US)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 495 days.

This patent is subject to a terminal disclaimer.

(21) Appl. No.: 13/495,830

(22) Filed: Jun. 13, 2012

(65) Prior Publication Data

US 2012/0319221 A1 Dec. 20, 2012

Related U.S. Application Data

(60) Provisional application No. 61/496,789, filed on Jun. 14, 2011.

(51) Int. Cl.
*G11C 11/16* (2006.01)
*H01L 43/08* (2006.01)
*H01L 27/22* (2006.01)

(52) U.S. Cl.
CPC .............. *H01L 43/08* (2013.01); *G11C 11/161* (2013.01); *H01L 27/228* (2013.01)

(58) Field of Classification Search
CPC .................................................. G11C 11/161
USPC .......................................... 365/158, 148, 171
See application file for complete search history.

(56) References Cited

U.S. PATENT DOCUMENTS

| | | | |
|---|---|---|---|
| 8,766,383 B2 * | 7/2014 | Apalkov et al. | 257/421 |
| 2006/0092696 A1 * | 5/2006 | Bessho | 365/171 |
| 2006/0132990 A1 | 6/2006 | Morise et al. | |
| 2008/0151614 A1 * | 6/2008 | Guo | 365/171 |
| 2011/0013448 A1 * | 1/2011 | Nozieres et al. | 365/173 |
| 2011/0305077 A1 * | 12/2011 | Higo et al. | 365/171 |
| 2013/0009260 A1 * | 1/2013 | Apalkov et al. | 257/421 |

OTHER PUBLICATIONS

A.D. Kent, et al., "Spin-Transfer-Induced Precessional Magnetization Reversal," Applied Physics Letters, vol. 84, No. 19, May 10, 2004, pp. 3897-3899.

* cited by examiner

*Primary Examiner* — Hoai V Ho
*Assistant Examiner* — Jay Radke
(74) *Attorney, Agent, or Firm* — Convergent Law Group LLP

(57) ABSTRACT

A method and system provide a magnetic junction usable in a magnetic device. The magnetic junction includes a first pinned layer having a first pinned layer magnetization, a first nonmagnetic spacer layer, and a free layer having an easy axis. The first nonmagnetic spacer layer is between the first pinned layer and the free layer. The magnetic junction is configured such that the free layer is switchable between a plurality of stable magnetic states when a write current is passed through the magnetic junction and such that the free layer employs precessional switching.

20 Claims, 6 Drawing Sheets

METHOD AND SYSTEM FOR PROVIDING A MAGNETIC JUNCTION CONFIGURED FOR PRECESSIONAL SWITCHING USING A BIAS STRUCTURE

CROSS-REFERENCE TO RELATED APPLICATIONS

This application claims the benefit of provisional Patent Application Ser. No. 61/496,789, filed Jun. 14, 2011 and is assigned to the assignee of the present application and incorporated herein by reference.

BACKGROUND OF THE INVENTION

Magnetic memories, particularly magnetic random access memories (MRAMs), have drawn increasing interest due to their potential for high read/write speed, excellent endurance, non-volatility and low power consumption during operation. An MRAM can store information utilizing magnetic materials as an information recording medium. One type of MRAM is a spin transfer torque random access memory (STT-RAM). STT-RAM utilizes magnetic junctions written at least in part by a current driven through the magnetic junction. A spin polarized current driven through the magnetic junction exerts a spin torque on the magnetic moments in the magnetic junction. As a result, layer(s) having magnetic moments that are responsive to the spin torque may be switched to a desired state.

For example, FIG. 1 depicts a conventional magnetic tunneling junction (MTJ) 10 that may be used in a conventional STT-RAM and that uses precessional switching. The conventional MTJ 10 typically uses conventional seed layer(s) 12 and includes a conventional antiferromagnetic (AFM) layer 14, a conventional pinned layer 16, a conventional tunneling barrier layer 18, a conventional free layer 20, a second conventional tunneling barrier layer 22, and a conventional pinned layer 24.

The conventional seed layer(s) 12 are typically utilized to aid in the growth of subsequent layers, such as the AFM layer 14, having a desired crystal structure. The conventional tunneling barrier layers 18 and 22 are nonmagnetic and are, for example, a thin insulator such as MgO.

The conventional pinned layers 16 and 24 and the conventional free layer 20 are magnetic. The magnetization 17 of the conventional pinned layer 16 is fixed, or pinned, in a particular direction, typically by an exchange-bias interaction with the AFM layer 14. The conventional free layer 20 has a changeable magnetization represented by easy axis 21. The magnetizations of the conventional pinned layer 16 and the conventional free layer 20 are thus oriented in plane. However, the conventional pinned layer 24 has its magnetization 25 oriented perpendicular to the plane of the layers.

The conventional MTJ 10 uses precession to switch the magnetization 21 of the conventional free layer 20. When a sufficient current is driven in the z-direction (along the positive or negative z-axis), a spin torque pulls the magnetization 21 of the conventional free layer 20 further from the easy axis 21. Because the free layer magnetization 21 is not along the easy axis, the demagnetization field of the free layer 20 is nonzero. The free layer magnetization precesses around this nonzero demagnetization field of the free layer 20. The free layer 20 may then switch from parallel to antiparallel to the magnetization 17 of the conventional pinned layer 16 or vice versa.

Although the conventional MTJ 10 may be written using spin transfer and used in an STT-RAM, there are drawbacks. If the current driven through the conventional MTJ 10 is not removed at a specific time, the magnetization of the conventional free layer 10 may precess back to its original position. Stated differently, the conventional free layer 20 may not switch if the timing of the removal of the current is not carefully controlled. The current may be removed and a current in the opposite direction may be used instead of a single current. However, the timing and shape of pulses may need to be closely controlled for such switching. Such close control of the current is generally undesirable. Alternatively, an external magnetic field may be applied to improve the switching reliability. However, in such conventional MTJs 10, the required external magnetic field increases as the size of the conventional MTJ decreases. Thus such a solution exhibits poor scalability. Thus, significant drawbacks exist to precessional switching in conventional MTJs 10.

Accordingly, what is needed is a method and system that may improve the precessional switching. The method and system described herein address such a need.

BRIEF SUMMARY OF THE INVENTION

The exemplary embodiments provide a magnetic junction usable in a magnetic device. The magnetic junction includes a first pinned layer, a first nonmagnetic spacer layer, and a free layer. The first nonmagnetic spacer layer is between the first pinned layer and the free layer. The magnetic junction is configured such that the free layer is switchable between a plurality of stable magnetic states when a write current is passed through the magnetic junction and such that precessional switching is used. In some aspects, the magnetic junction includes a second nonmagnetic spacer layer, a second pinned layer having a second pinned layer magnetization, and a bias structure. The first pinned layer magnetization is substantially in-plane while the second pinned layer magnetization is substantially perpendicular to plane. The bias structure provides a magnetic bias at the free layer. The bias structure has a magnetic portion substantially exchange decoupled from the second pinned layer. The magnetic bias is substantially in-plane and perpendicular to the easy axis of the free layer. In another aspect, the first pinned layer has a center, a first edge, and a second edge. The first pinned layer magnetization varies across the first pinned layer such that the first pinned layer is substantially perpendicular-to-plane at at least the first edge and the second edge and is substantially in plane at the center.

DETAILED DESCRIPTION OF THE INVENTION

Figure 1:
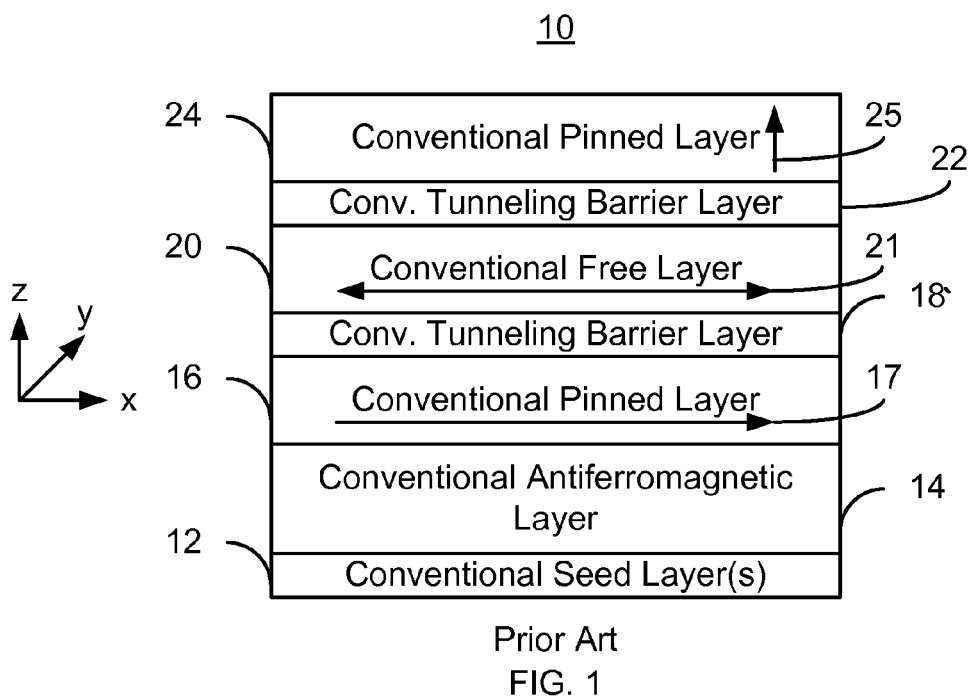
FIG. 1 depicts a conventional magnetic junction.

The exemplary embodiments relate to magnetic junctions usable in magnetic devices, such as magnetic memories, and the devices using such magnetic junctions. The following description is presented to enable one of ordinary skill in the art to make and use the invention and is provided in the context of a patent application and its requirements. Various modifications to the exemplary embodiments and the generic principles and features described herein will be readily apparent. The exemplary embodiments are mainly described in terms of particular methods and systems provided in particular implementations. However, the methods and systems will operate effectively in other implementations. Phrases such as "exemplary embodiment", "one embodiment" and "another embodiment" may refer to the same or different embodiments as well as to multiple embodiments. The embodiments will be described with respect to systems and/or devices having certain components. However, the systems and/or devices may include more or less components than those shown, and variations in the arrangement and type of the components may be made without departing from the scope of the invention. The exemplary embodiments will also be described in the context of particular methods having certain steps. However, the method and system operate effectively for other methods having different and/or additional steps and steps in different orders that are not inconsistent with the exemplary embodiments. Thus, the present invention is not intended to be limited to the embodiments shown, but is to be accorded the widest scope consistent with the principles and features described herein.

The exemplary embodiments are described in the context of particular magnetic junctions and magnetic memories having certain components. One of ordinary skill in the art will readily recognize that the present invention is consistent with the use of magnetic junctions and magnetic memories having other and/or additional components and/or other features not inconsistent with the present invention. The method and system are also described in the context of current understanding of the spin transfer phenomenon, of magnetic anisotropy, and other physical phenomena. Consequently, one of ordinary skill in the art will readily recognize that theoretical explanations of the behavior of the method and system are made based upon this current understanding of spin transfer, magnetic anisotropy and other physical phenomena. However, the method and system described herein are not dependent upon a particular physical explanation. One of ordinary skill in the art will also readily recognize that the method and system are described in the context of a structure having a particular relationship to the substrate. However, one of ordinary skill in the art will readily recognize that the method and system are consistent with other structures. In addition, the method and system are described in the context of certain layers being synthetic and/or simple. However, one of ordinary skill in the art will readily recognize that the layers could have another structure. Furthermore, the method and system are described in the context of magnetic junctions and/or substructures having particular layers. However, one of ordinary skill in the art will readily recognize that magnetic junctions and/or substructures having additional and/or different layers not inconsistent with the method and system could also be used. Moreover, certain components are described as being magnetic, ferromagnetic, and ferrimagnetic. As used herein, the term magnetic could include ferromagnetic, ferrimagnetic or like structures. Thus, as used herein, the term "magnetic" or "ferromagnetic" includes, but is not limited to ferromagnets and ferrimagnets. The method and system are also described in the context of single magnetic junctions and substructures. However, one of ordinary skill in the art will readily recognize that the method and system are consistent with the use of magnetic memories having multiple magnetic junctions and using multiple substructures. Further, as used herein, "in-plane" is substantially within or parallel to the plane of one or more of the layers of a magnetic junction. Conversely, "perpendicular" corresponds to a direction that is substantially perpendicular to one or more of the layers of the magnetic junction.

The exemplary embodiments provide a magnetic junction usable in a magnetic device. The magnetic junction includes a pinned layer, a nonmagnetic spacer layer, and a free layer. The nonmagnetic spacer layer is between the pinned layer and the free layer. The magnetic junction is configured such that the free layer is switchable between a plurality of stable magnetic states when a write current is passed through the magnetic junction. At least one of the free layer and the pinned layer include at least one half-metal.

Figure 2:
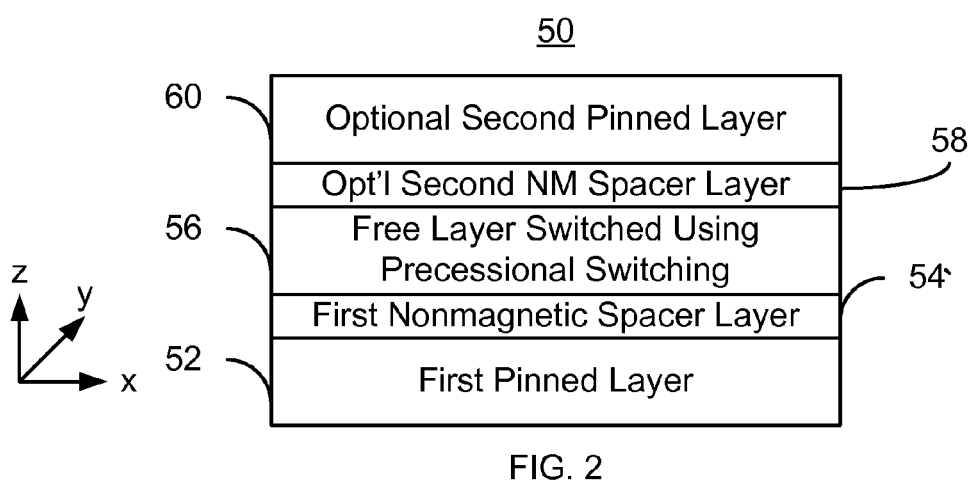
FIG. 2 depicts an exemplary embodiment of a magnetic junction utilizing precessional switching.

FIG. 2 depicts an exemplary embodiment of a magnetic junction 50 usable in a magnetic memory or other device and that utilizes precessional switching. For example, the magnetic junction 50 may be a single or dual magnetic tunneling junction (MTJ), spin valve, or ballistic magnetoresistance structure, or some combination thereof. The magnetic junction 50 may be used in a variety of applications. For example, the magnetic junction may be used in a magnetic memory such as an STT-RAM. For clarity, FIG. 2 is not to scale. The magnetic junction 50 includes a first pinned layer 52, a first nonmagnetic spacer layer 54, a free layer 56, an optional second nonmagnetic spacer layer 58, and an optional second pinned layer 60. In some embodiments, other components such as a bias structure (described below) may be included.

The free layer 56 may be switched using STT torque. In addition, the magnetic moment (not explicitly shown) undergoes precessional switching. Stated differently, precession of the magnetic moment of the free layer 56 around its equilibrium location is used in switching the magnetic moment of the free layer 56. This is in contrast to the conventional magnetic junction 10 for which switching uses precession around a demagnetization field after the free layer magnetic moment is pulled away from the equilibrium position by spin transfer torque. Thus, the magnetic junction 50 may have improved switching times.

Figure 3:
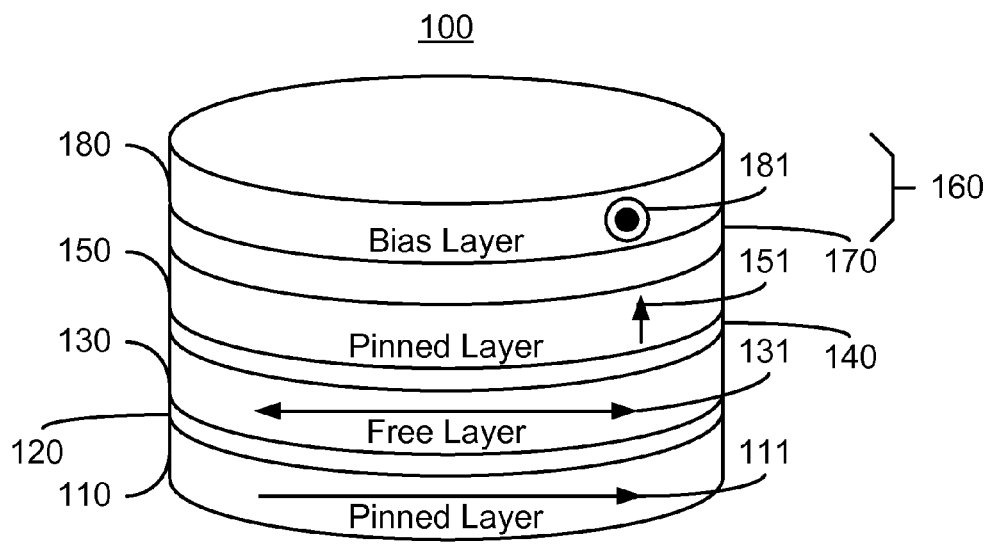
FIG. 3 depicts an exemplary embodiment of a magnetic junction.

FIG. 3 depicts an exemplary embodiment of a magnetic junction 100 usable in a magnetic memory or other device. For example, the magnetic junction 100 may be a dual magnetic tunneling junction (MTJ), spin valve, or ballistic magnetoresistance structure, or some combination thereof. The magnetic junction 100 may be used in a variety of applications. For example, the magnetic junction may be used in a magnetic memory such as an STT-RAM. For clarity, FIG. 3 is not to scale. The magnetic junction 100 includes a first pinned layer 110, a first nonmagnetic spacer layer 120, a free layer 130, a second nonmagnetic spacer layer 140, a second pinned layer 150, and a bias structure 160. The bias structure 160 includes a magnetic bias layer 180 and a nonmagnetic layer 170. The nonmagnetic layer 170 is configured to reduce or break the magnetic exchange coupling between the pinned layer 150 and the magnetic bias layer 180. In some embodiments, the nonmagnetic layer may include Ta, Ru, Zr, Pd, Ag, Hf, Pt, Au, Nb, Mo, Mg, Cr, V, Cu, Al, AlO, Ti, W, and/or MgO. In addition to breaking exchange coupling between the pinned layer 150 and bias layer 180, the nonmagnetic layer 170 can be used to help increase perpendicular anisotropy in the pinned layer 150. In other embodiments, other materials might be used. In an alternate embodiment, the exchange coupling between the layers 150 and 180 may be broken in another manner. Although layers 110, 120, 130, 140, 150, and 170 are shown with a particular orientation, this orientation may vary in other embodiments. For example, the pinned layer 110 may be at the top (furthest from a substrate that is not shown) of the magnetic junction 100.

The pinned layers 110 and 150, as well as free layer 130 are ferromagnetic. Thus, layers 110, 130, and 150 may include one or more of Ni, Fe, and Co, particularly in an alloy form. In some embodiments, the layers 110, 130, and 150 include CoFe. In some such embodiments, the layers 110, 130, and 150 consist of CoFeB. In addition to that, pinned layer 150 may include one of Pt, Pd, Tb, Mn, Al, Mg, MgO, Ta, Ru and can be a multilayer of several materials. In addition, during deposition of pinned layer 150 or any other materials, in-situ heating can be used to maximize the perpendicular anisotropy of this layer. The layers 110, 130, and 150 are configured to be stable at room temperature. For example, the magnetic anisotropy energy for the layers 110, 130 and/or 150 may be at least sixty times $k_bT$ or greater. In some embodiments, the magnetic anisotropy energies for the layers 110, 130, and/or 150 are at least eighty times $k_bT$ at room temperature (approximately thirty degrees centigrade). Although the layers 110, 130, and 150 are depicted as simple layers, in other embodiments, one or more of the layers 110, 130, and 150 may be a multilayer. For example, the pinned layer 110 and/or the free layer 130 may be a SAF including magnetic layers antiferromagnetically or ferromagnetically coupled through thin layers, such as Ru. In such a SAF, multiple magnetic layers interleaved with thin layer(s) of Ru or other material may be used. The layer 110, 130, and/or 150 may also be another multilayer.

The pinned layer 110 and free layer 130 are magnetic and in-plane. The pinned layer 110 has magnetization 111. The changeable magnetization of the free layer 130 is shown by easy axis 131. The reference number 131 is thus used to indicate both the easy axis and the magnetization of the free layer 130. The magnetizations 111 and 131 of the layers 110 and 130, respectively, are substantially in-plane. Thus, the out-of-plane demagnetization energy of the layers 110 and 130 exceeds the out-of-plane anisotropy. The out-of-plane demagnetization energy approaches $4\pi M_s$ for large cells, but is generally less than $4\pi M_s$ for smaller cells due to decreased demagnetization field at the edges.

Although the magnetization 131 of the free layer 130 is in-plane, in some embodiments, the free layer 130 has a high perpendicular anisotropy. Stated differently, the free layer 130 may be weakly in-plane. For example, in some such embodiments, the perpendicular anisotropy energy of the free layer 130 may be close to, but less than, the out-of-plane demagnetization energy. For example, the perpendicular anisotropy energy may be at least forty percent of the out-of-plane demagnetization energy. In some such embodiments, the perpendicular anisotropy energy may be at least eighty percent of the out-of-plane demagnetization energy. Also in some embodiments, the perpendicular anisotropy energy is not more than ninety percent of the demagnetization energy. The high perpendicular anisotropy may be achieved in a variety of ways including but not limited to use of a desired capping layer, such as MgO in addition to or as the nonmagnetic spacer layer 120 and/or 140. The free layer 130 may also have a high damping, for example due to doping or through the use of a multilayer. For example, in some embodiments, the magnetic damping may be greater than or equal to 0.01. The free layer 130 may also use half-metallic ferromagnetic materials or other materials that improve spin transfer, magnetoresistance, and/or other desired properties. Finally, the magnetic junction 100 is configured such that the free layer magnetization 131 is switchable using a current driven through the magnetic junction. Thus, the magnetic junction 100 utilizes spin transfer torque. In some embodiments, other phenomena may be used in addition to or in lieu of spin transfer torque to switch the magnetic junction.

The nonmagnetic spacer layers 120 and 140 may be conductive, tunneling barrier layers, insulating layers having conductive channels, or other nonmagnetic layers for which the magnetic junction 100 has a magnetoresistance. In some embodiments, the spacer layers 120 and/or 140 are MgO. In some such embodiments, the nonmagnetic spacer layer(s) 120 and/or 140 are crystalline MgO, which may enhance the tunneling magnetoresistance (TMR) of the magnetic junction 100. In other embodiments, the spacer layer may be a conductor, such as Cu. In alternate embodiments, the nonmagnetic spacer layer 120 and/or 140 might have another structure, for example a granular layer including conductive channels in an insulating matrix.

The bias structure 160 provides a magnetic bias at the free layer 130 that is substantially perpendicular to the easy axis 131 and in-plane at the free layer 130. In the embodiment shown, the magnetic bias is provided by the bias layer 180. Thus, the bias layer 180 has a magnetization 181 that is perpendicular to the easy axis 131 of the free layer 130 and that is in plane. Stated differently, the bias layer magnetization 181 is along the in-plane hard axis of the free layer 130. In some embodiments, the magnetic bias field at the free layer has a magnitude of at least twenty percent and not more than sixty percent of the effective anisotropy field of the free layer 130.

In operation, a write current is driven through the magnetic junction 100. The spin transfer torque generated may cause the magnetization of the free layer 130 to cant farther away from the easy axis 131. The demagnetization field for the free layer is thus nonzero. The free layer 130 magnetization then precesses around the demagnetization field. The write current may then be removed. The static bias field generated by the bias structure 160 and, more specifically, the bias layer 180 still acts upon the free layer 130. This bias field oriented along the hard axis aids in bringing the magnetization of the free layer 130 back in-plane. Because of the presence of the field (not shown) from the bias layer 180, the precessing magnetization of the free layer 130 will return to being in-plane. More specifically, when the write current is removed from the magnetic junction 100, the magnetization of the free layer 130 then tends to return to an in plane position. This occurs because of the bias field generated by the bias layer 180. If the bias field from the bias structure 160 is sufficiently strong, the free layer 130 switches reproducibly to the desired state. In such embodiments, the bias field is at least twenty percent of the free layer 130. In other embodiments, the magnetic junction 100 may not reproducibly switch unless the write current is removed at a particular time. However, application of the static bias field still increases the margin in time for the current removal. Thus, reliable switching may be achieved with relaxed tolerances on the timing of the write current.

To read the data stored by the magnetic junction 120, a read current may be driven through the magnetic junction 100. Based on the relative orientations of the magnetizations 111 and 131 of the pinned layer 110 and the free layer 130, respectively, a magnetoresistance is provided.

The magnetic junction 100 may have improved characteristics. The magnetic junction 100 employs precessional switching. Thus, magnetic junction 100 may have improved (faster) switching times. In some embodiments, the switching times are on the order of fifty to one hundred picoseconds. As discussed above, the presence of the bias field due to the bias structure 160 may make precessional switching of the free layer 130 using spin transfer torque more reliable. More specifically, the magnetization of the free layer 130 may be more reliably brought back in plane and/or the margins for timing of removal of the write current may be increased. Further, the bias field is a magnetostatic field from the magnetic bias layer 180. Thus, the magnetic bias increases with reductions in the in-plane size of the structure. Scalability of the magnetic junction 100 to smaller sizes may thus be improved. Performance of the magnetic junction 100 may be further enhanced. For example, an increase in the damping of the free layer 130 does not change the critical switching current, but does make it easier to trap the magnetization of the free layer 130 in its final state. Thus, switching may be more reliable. The perpendicular anisotropy of the free layer 130 may also be increased (though remaining below the out-of-plane demagnetization energy). In such embodiments, reliability of the switching may also be enhanced for example by increasing margins for timing of removal of the write current. Thus, performance of the magnetic junction 100 may be improved.

Figure 4:
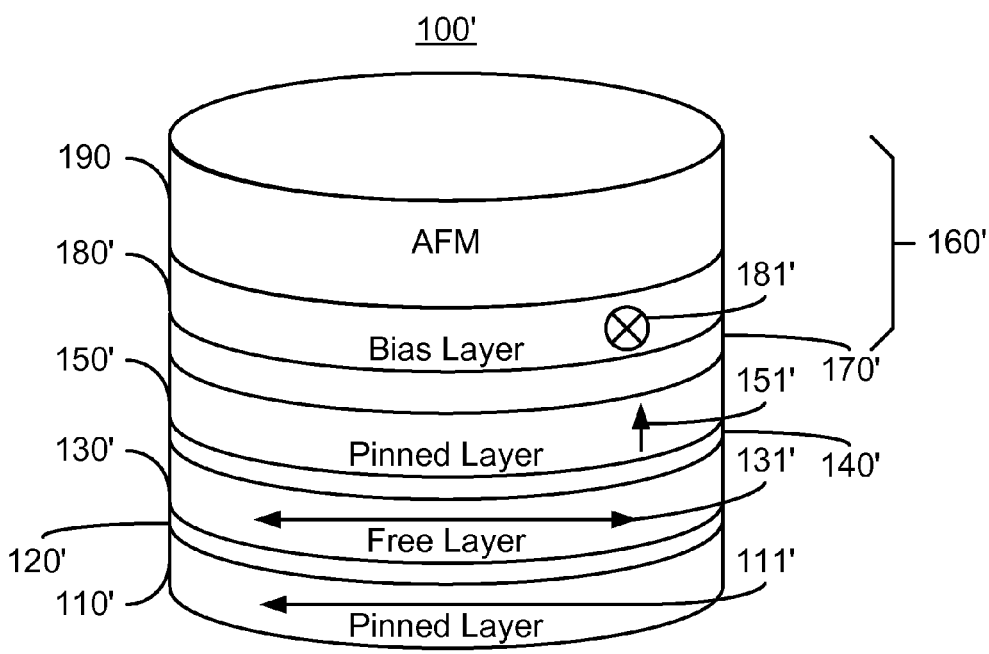
FIG. 4 depicts another exemplary embodiment of a magnetic junction.

FIG. 4 depicts an exemplary embodiment of a magnetic junction 100'. For clarity, FIG. 4 is not to scale. The magnetic junction 100' is analogous to the magnetic junction 100. Consequently, analogous components are labeled similarly. The magnetic substructure 100' thus includes a first pinned layer 110', a first nonmagnetic spacer layer 120', a free layer 130', a second nonmagnetic spacer layer 140', a second pinned layer 150' and bias structure 160' including bias layer 180' and spacer layer 170' that are analogous to first pinned layer 110, the first nonmagnetic spacer layer 120, the free layer 130, the second nonmagnetic spacer layer 140, the second pinned layer 150' and the bias structure 160 including bias layer 180 and spacer layer 170.

The structure and function of the layers 110', 120', 130', 140', 150', 170' and 180' are analogous to the structure and function of the layers 110, 120, 130, 140, 150, 170, and 180, respectively. In addition, AFM layer 190 is shown. The AFM layer 190 is used to fix the magnetization 181' of the bias layer 180' along the hard axis of the free layer 130.

The magnetic junction 100' shares the benefits of the magnetic junction 100. For example, improved reliability and margins for precessional switching may be achieved. Scalability of the magnetic junction 100' may also be enhanced.

Figure 5:
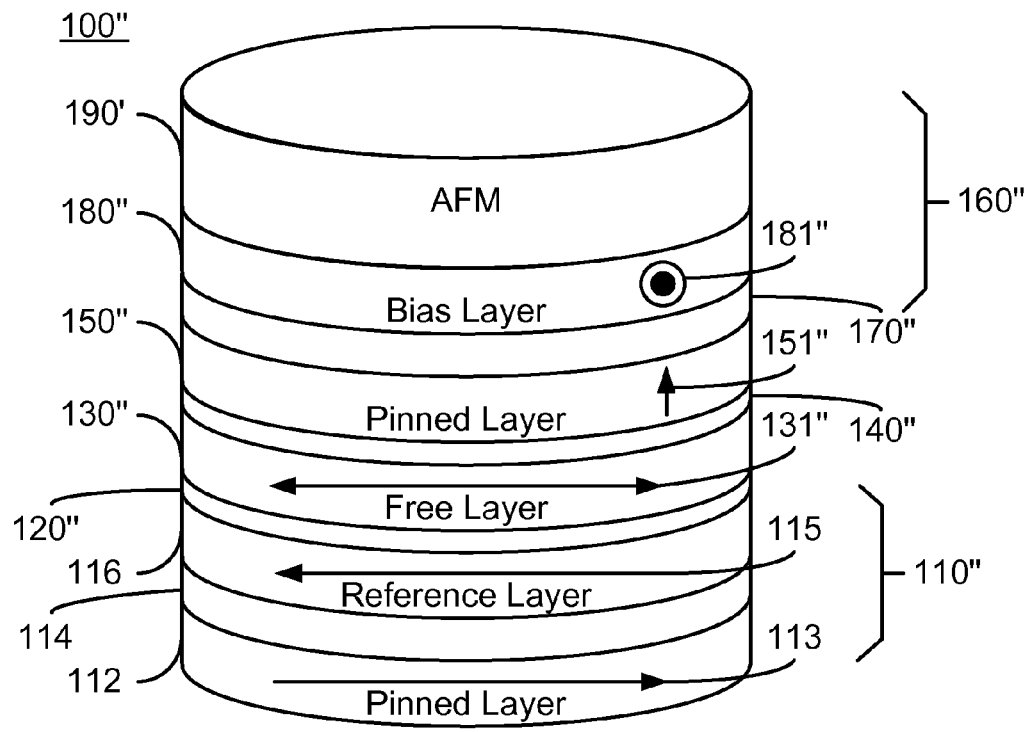
FIG. 5 depicts another exemplary embodiment of a magnetic junction.

FIG. 5 depicts an exemplary embodiment of a magnetic junction 100". For clarity, FIG. 5 is not to scale. The magnetic junction 100" is analogous to the magnetic junctions 100 and 100'. Consequently, analogous components are labeled similarly. The magnetic substructure 100" thus includes a first pinned layer 110", a first nonmagnetic spacer layer 120", a free layer 130", a second nonmagnetic spacer layer 140", a second pinned layer 150" and bias structure 160" including bias layer 180", spacer layer 170", and AFM layer 190' that are analogous to first pinned layer 110/110', the first nonmagnetic spacer layer 120/120', the free layer 130/130', the second nonmagnetic spacer layer 140/140', the second pinned layer 150/150' and the bias structure 160/160' including bias layer 180/180', spacer layer 170/170', and AFM layer 190.

The structure and function of the layers 110", 120", 130", 140", 150", 170", 180", and 190' are analogous to the structure and function of the layers 110/110', 120/120', 130/130', 140/140', 150/150', 170/170', 180/180', and 190', respectively. In addition, pinned layer 110" is shown as being a multilayer SAF. More specifically, pinned layer 112 having magnetization 113, reference layer 116 having magnetization 115, and nonmagnetic layer 114 are shown. Although not shown, other layers including but not limited to the free layer 130" may be a SAF or other multilayer.

The magnetic junction 100" shares the benefits of the magnetic junctions 100 and 100'. For example, improved reliability and margins for precessional switching may be achieved. Scalability of the magnetic junction 100" may also be enhanced.

Figure 6:
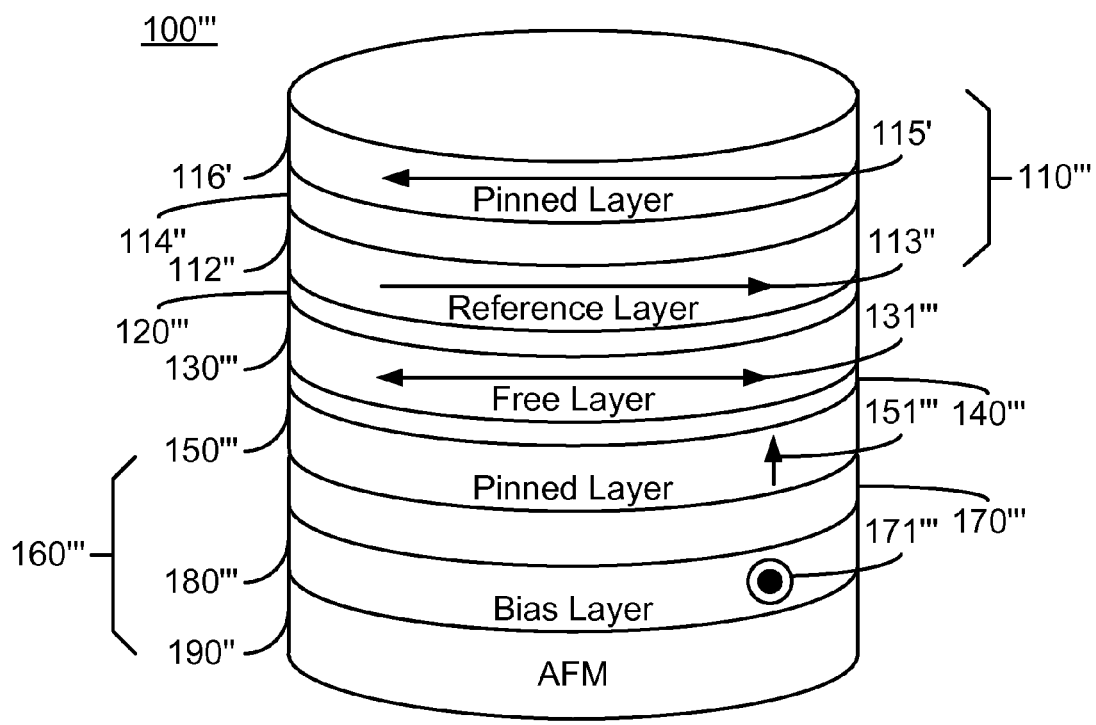
FIG. 6 depicts another exemplary embodiment of a magnetic junction.

FIG. 6 depicts an exemplary embodiment of a magnetic junction 100'''. For clarity, FIG. 6 is not to scale. The magnetic junction 100''' is analogous to the magnetic junctions 100, 100', and 100'. Consequently, analogous components are labeled similarly. The magnetic substructure 100''' thus includes a first pinned layer 110''', a first nonmagnetic spacer layer 120''', a free layer 130''', a second nonmagnetic spacer layer 140''', a second pinned layer 150''' and bias structure 160''' including bias layer 180''', spacer layer 170''', and AFM layer 190'' that are analogous to first pinned layer 110/110'/110", the first nonmagnetic spacer layer 120/120'/120", the free layer 130/130'/130", the second nonmagnetic spacer layer 140/140'/140", the second pinned layer 150/150'/150" and the bias structure 160/160'/160" including bias layer 180/180'/180", spacer layer 170/170'/17" and AFM layer 190/190'.

The structure and function of the layers 110''', 120''', 130''', 140''', 150''', 170''', 180''', and 190'' are analogous to the structure and function of the layers 110/110'/110", 120/120'/120", 130/130'/130", 140/140'/140", 150/150'/150", 170/170'/170", 180/180'/180", and 190/190', respectively. In addition, the relationship to the substrate of the layers 110''', 120''', 130''', 140''', 150''', 170''', 180''', and 190'' has been reversed. However, the function of the magnetic junction 100''' may be substantially unchanged.

The magnetic junction 100''' shares the benefits of the magnetic junctions 100, 100', and 100". For example, improved reliability and margins for precessional switching may be achieved. Scalability of the magnetic junction 100''' may also be enhanced.

Figure 7A:
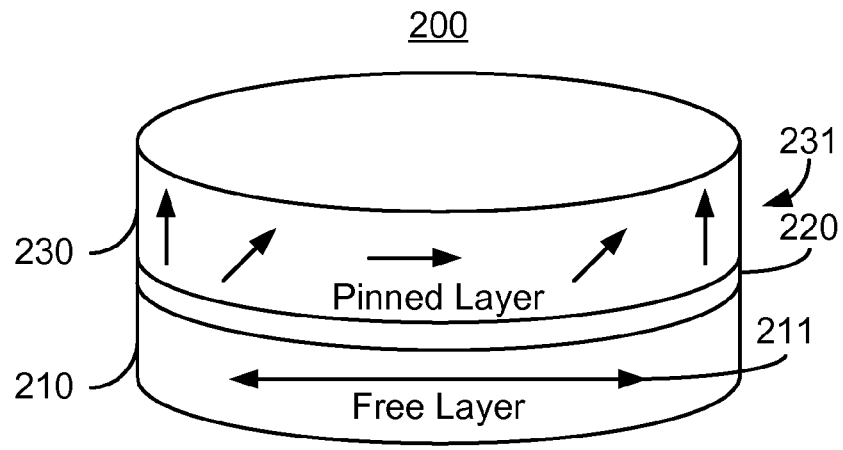
FIGS. 7A and 7B depict another exemplary embodiment of a magnetic junction.
Figure 7B:
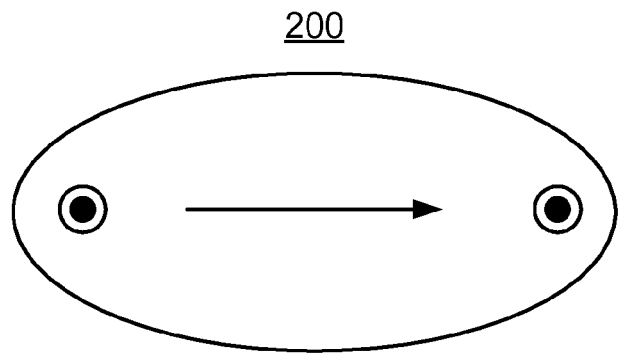

FIGS. 7A-7B depict perspective and top views of an exemplary embodiment of a magnetic junction 200 utilizing precessional switching. For clarity, FIGS. 7A-7B are not to scale. The magnetic junction 200 includes a free layer 210, a nonmagnetic spacer layer 220, and a pinned layer 230. Although layers 210, 220, and 230 are shown with a particular orientation, this orientation may vary in other embodiments. For example, the free layer 210 may be closer to the top (furthest from a substrate that is not shown) of the magnetic junction 200. Although depicted as a simple layer, the free layer 210 may include multiple layers. For example, the pinned layer 210 may be a SAF including magnetic layers antiferromagnetically or ferromagnetically coupled through thin layers, such as Ru. In such a SAF, multiple magnetic layers interleaved with thin layer(s) of Ru or other material may be used. The free layer 210 may also be another multilayer.

The free layer 210 has a magnetization shown by easy axis 211. The free layer 210 is analogous to the free layer 130/130'/130"/130'''. For example, the free layer 210 may be a SAF, have a high perpendicular anisotropy, and/or a higher damping. The spacer layer 220 is nonmagnetic. In some embodiments, the spacer layer 220 is an insulator, for example a tunneling barrier. In such embodiments, the spacer layer 220 may include crystalline MgO, which may enhance the TMR of the magnetic junction. In other embodiments, the spacer layer may be a conductor, such as Cu. In alternate embodiments, the spacer layer 220 might have another structure, for example a granular layer including conductive channels in an insulating matrix.

The pinned layer 230 has a magnetization 231 that varies across the pinned layer 230. In some regions, the magnetization 231 is in plane, while in others the magnetization is perpendicular to plane. In the embodiment shown, the center of the pinned layer 230 has an in-plane magnetization while the edges of the pinned layer 230 are perpendicular to plane. This may be achieved, for example, by having a high perpendicular anisotropy. In some embodiments, the perpendicular anisotropy is at least 85% but less than 100% of the demagnetization energy.

Because the magnetization of the pinned layer 230 varies across the pinned layer 230, the pinned layer 230 may function as a combination of the pinned layers 110 and 150 of FIG. 3.

In particular, the edges having the out-of-plane magnetization may enhance precessional switching in a manner analogous to the pinned layer 150 of the magnetic junction 100. The central portion of the pinned layer 230 may be considered to be the portion of the pinned layer 230 used for reading. In other words, the orientation of the magnetization of the free layer 210' versus that of the central portion of the pinned layer 230 gives rise to the magnetoresistance of the magnetic junction 200.

Because the magnetic junction 200 may use precessional switching, higher speed switching may be accomplished. Further, as fewer layers may be used, processing may be simplified.

Figure 8:
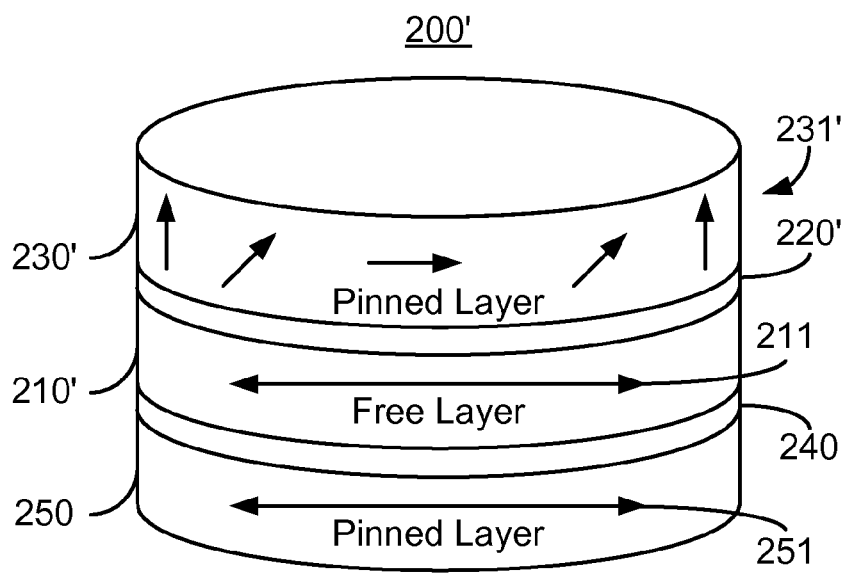
FIG. 8 depicts another exemplary embodiment of a magnetic junction.

FIG. 8 depicts an exemplary embodiment of a magnetic junction 200'. For clarity, FIG. 8 is not to scale. The magnetic junction 200' is analogous to the magnetic junction 200. Consequently, analogous components are labeled similarly. The magnetic substructure 200' thus includes a free layer 210', a first nonmagnetic spacer layer 220', and a pinned layer 230' analogous to the free layer 210, the nonmagnetic spacer layer 220, and the pinned layer 230, respectively. In addition, the magnetic junction 200' also includes an additional nonmagnetic spacer layer 240 and an additional pinned layer 250. Thus, the magnetic junction 200 is a dual magnetic junction. The magnetic junction 200' shares the benefits of the magnetic junction 200. For example, precessional switching may be achieved. The magnetization 251 of pinned layer 250 may be parallel or antiparallel to magnetization at the center of layer 230' depending on specific applications and desired attributes of the structure. In addition, even though it is not shown on the figure, the bias structure similar to 160/160' can be combined with the magnetic junction 200 to provide additional benefit for the switching.

Figure 9:
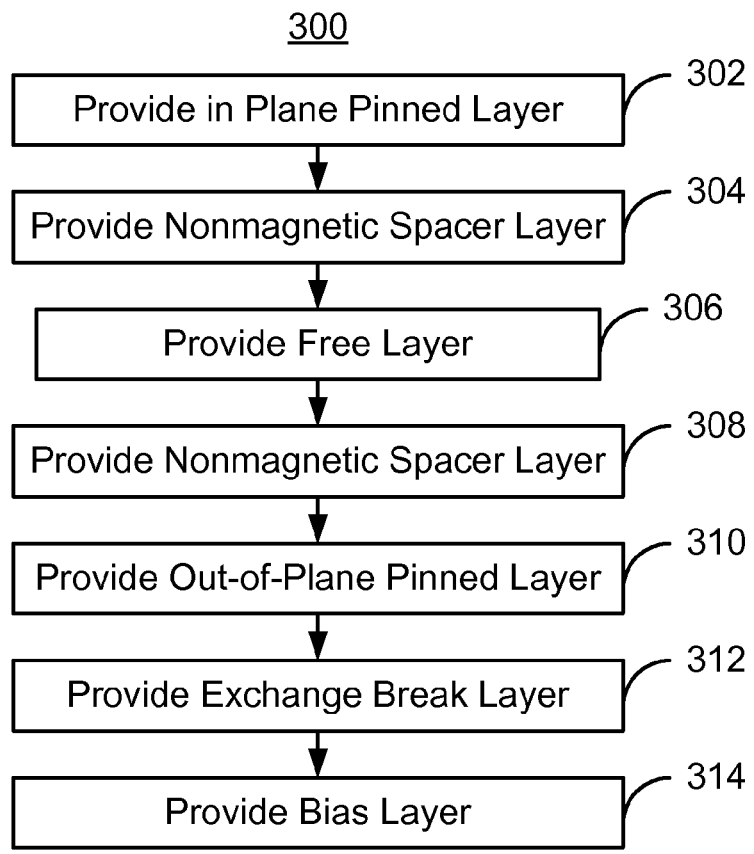
FIG. 9 depicts an exemplary embodiment of a method for providing a magnetic substructure.

FIG. 9 depicts an exemplary embodiment of a method 300 for fabricating magnetic junction. For simplicity, some steps may be omitted or combined. The method 300 is described in the context of the magnetic junction 100. However, the method 300 may be used on other magnetic junctions such as the junction 100', 100", 100''' and/or 200. Further, the method 300 may be incorporated into fabrication of magnetic memories. Thus the method 300 may be used in manufacturing a STT-RAM or other magnetic memory.

The pinned layer 110 is provided, via step 302. Step 302 may include depositing the desired materials at the desired thickness of the pinned layer 110. The nonmagnetic spacer layer 120 is provided, via step 304. Step 304 may include depositing the desired nonmagnetic materials. In addition, the desired thickness of material may be deposited in step 304. The free layer 130 is provided, via step 306. The nonmagnetic spacer 140 is provided, via step 308. The pinned layer 150, which has a perpendicular to plane magnetization 151, is provided, via step 310. The bias structure 160 is provided in step 312 and 314. More specifically, the nonmagnetic layer 170 used to break the exchange coupling between the pinned layer 150 and bias layer 180 is provided, via step 312. The bias layer 180 is also provided, via step 314. Step 314 may also include providing the AFM layer 190.

Figure 10:
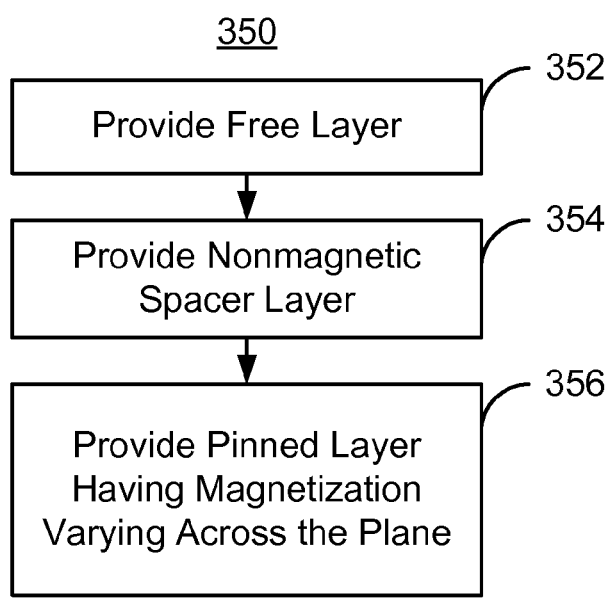
FIG. 10 depicts another exemplary embodiment of a method for providing a magnetic substructure.

FIG. 10 depicts an exemplary embodiment of a method 350 for fabricating magnetic junction. For simplicity, some steps may be omitted or combined. The method 350 is described in the context of the magnetic junction 200. However, the method 350 may be used on other magnetic junctions such as the junction 200'. Further, the method 350 may be incorporated into fabrication of magnetic memories. Thus the method 350 may be used in manufacturing a STT-RAM or other magnetic memory.

The free layer 210 is provided, via step 352. Step 352 may include depositing the desired materials at the desired thickness of the free layer 210. Further, step 352 may include providing a SAF. The nonmagnetic layer 220 is provided, via step 314. Step 314 may include depositing the desired nonmagnetic materials, including but not limited to crystalline MgO. In addition, the desired thickness of material may be deposited in step 314. The pinned layer 230 having the magnetization 231 that varies across the layer 230 is provided, via step 356.

Figure 11:
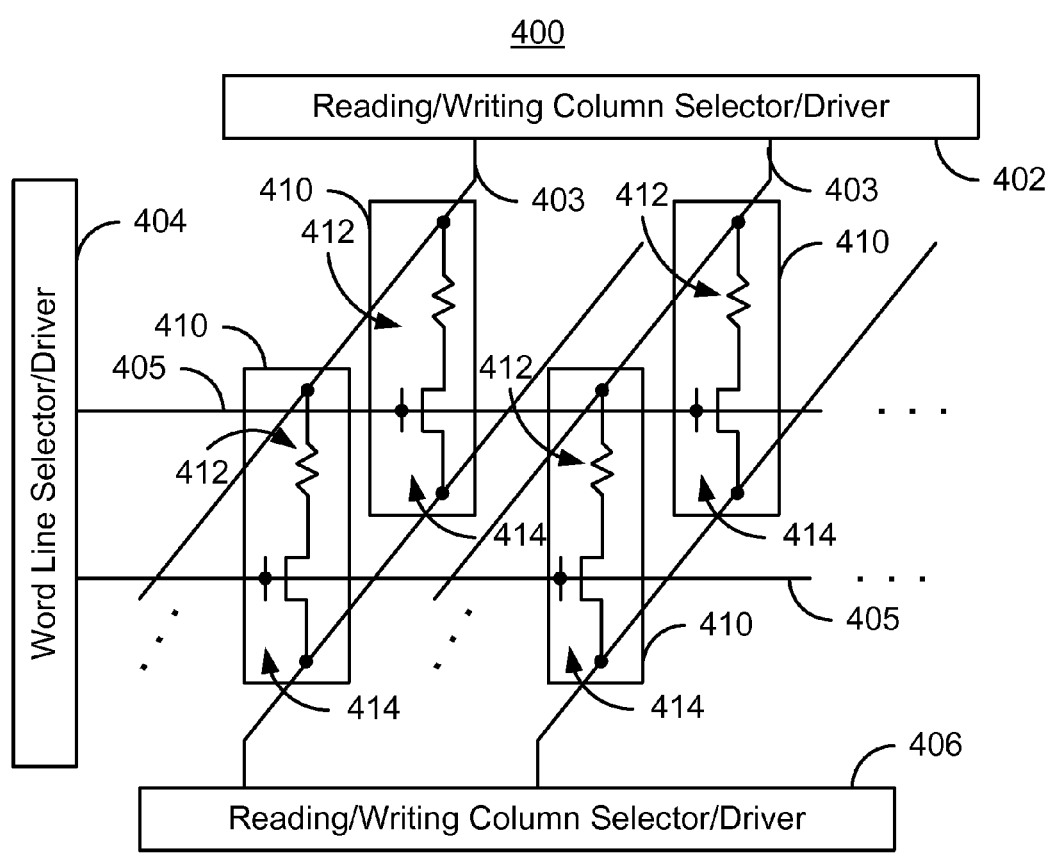
FIG. 11 depicts an exemplary embodiment of a memory utilizing magnetic junctions in the memory element(s) of the storage cell(s).

The magnetic junctions 100, 100', 100", 100''', 200, and/or 200' may be used in a magnetic memory. FIG. 11 depicts an exemplary embodiment of one such memory 400. The magnetic memory 400 includes reading/writing column select drivers 402 and 406 as well as word line select driver 404. Note that other and/or different components may be provided. The storage region of the memory 400 includes magnetic storage cells 410. Each magnetic storage cell includes at least one magnetic junction 412 and at least one selection device 414. In some embodiments, the selection device 414 is a transistor. The magnetic junctions 412 may be one of the magnetic junctions 100, 100', 100", 100''', 200, and/or 200'. Although one magnetic junction 412 is shown per cell 410, in other embodiments, another number of magnetic junctions 412 may be provided per cell. As such, the magnetic memory 400 may enjoy the benefits described above, such as faster and more reliable switching.

A method and system for providing a magnetic substructure, a magnetic junction and a memory fabricated using the magnetic junction has been described. The method and system have been described in accordance with the exemplary embodiments shown, and one of ordinary skill in the art will readily recognize that there could be variations to the embodiments, and any variations would be within the spirit and scope of the method and system. Accordingly, many modifications may be made by one of ordinary skill in the art without departing from the spirit and scope of the appended claims.

We claim:

1. A magnetic junction for use in a magnetic device comprising:
   a first pinned layer having a first pinned layer magnetization, the first pinned layer magnetization being substantially in-plane;
   a first nonmagnetic spacer layer; and
   a free layer having an easy axis and a free layer magnetic moment, the first nonmagnetic spacer layer residing between the first pinned layer and the free layer, wherein the magnetic junction is configured such that the free layer is switchable between a plurality of stable magnetic states when a write current is passed through the magnetic junction and such that the free layer employs switching based upon precession of the free layer magnetic moment around the easy axis of the free layer.

2. A magnetic junction for use in a magnetic device comprising:
- a first pinned layer having a first pinned layer magnetization, the first pinned layer magnetization being substantially in-plane;
- a first nonmagnetic spacer layer; and
- a free layer having an easy axis, the first nonmagnetic spacer layer residing between the first pinned layer and the free layer;
- a second nonmagnetic spacer layer, the free layer residing between the first nonmagnetic spacer layer and the second nonmagnetic spacer layer;
- a second pinned layer having a second pinned layer magnetization, the second pinned layer magnetization being substantially perpendicular to plane, the second spacer layer residing between the second pinned layer and free layer; and
- a bias structure providing a magnetic bias at the free layer, the bias structure having a magnetic portion substantially exchange decoupled from the second pinned layer, the magnetic bias being substantially in-plane and perpendicular to the easy axis of the free layer, wherein the magnetic junction is configured such that the free layer is switchable between a plurality of stable magnetic states when a write current is passed through the magnetic junction and such that the free layer employs precessional switching.

3. The magnetic junction of claim 2 wherein the bias structure includes a bias layer having a bias layer magnetization, the bias layer magnetization being substantially perpendicular to the easy axis of the free layer and in-plane.

4. The magnetic junction of claim 3 wherein the free layer has an effective in-plane anisotropy field, and wherein the magnetic bias field at the free layer corresponds to a magnitude of at least twenty percent and not more than sixty percent of the effective anisotropy field.

5. The magnetic junction of claim 3 wherein the free layer has a partial perpendicular anisotropy corresponding to perpendicular anisotropy energy and a demagnetizing field corresponding to an out-of-plane demagnetization energy, the perpendicular anisotropy energy being less than out-of-plane demagnetizing energy.

6. The magnetic junction of claim 5 wherein the perpendicular anisotropy energy is at least forty percent of the out-of plane demagnetizing energy.

7. The magnetic junction of claim 6 wherein the perpendicular anisotropy energy is at least eighty percent and not more than ninety percent of the out-of plane demagnetizing energy.

8. The magnetic junction of claim 3 wherein the free layer has a magnetic damping of greater than or equal to 0.01.

9. The magnetic junction of claim 3 further comprising:
- a nonmagnetic layer residing between the bias layer and the second pinned layer, the nonmagnetic layer for exchange decoupling the bias layer from the second pinned layer.

10. The magnetic junction of claim 9 wherein the nonmagnetic layer includes at least one of Ta, Ru, W, Ti, Cr, Mg, Cu, AlO, Zr, Pd, Ag, Hf, Pt, Au, Nb, Mo, V, Al, and MgO.

11. A magnetic junction for use in a magnetic device comprising:
- a first pinned layer having a first pinned layer magnetization, the first pinned layer magnetization being substantially in-plane;
- a first nonmagnetic spacer layer; and
- a free layer having an easy axis, the first nonmagnetic spacer layer residing between the first pinned layer and the free layer, wherein the magnetic junction is configured such that the free layer is switchable between a plurality of stable magnetic states when a write current is passed through the magnetic junction and such that the free layer employs precessional switching, wherein the first pinned layer has a center, a first edge, and a second edge, the first nonmagnetic spacer layer residing between the free layer and the first pinned layer, the first pinned layer magnetization varying across the first pinned layer such that the first pinned layer magnetization is substantially perpendicular-to-plane at at least the first edge and the second edge and is substantially in plane at the center.

12. The magnetic junction of claim 11 wherein the first pinned layer has an out-of-plane demagnetization energy and a perpendicular anisotropy that is at least eighty-five percent of the out-of-plane demagnetization energy.

13. The magnetic junction of claim 11 wherein the free layer has a partial perpendicular anisotropy corresponding to perpendicular anisotropy energy and a demagnetizing field corresponding to an out-of-plane demagnetization energy, the perpendicular anisotropy energy being less than out-of-plane demagnetizing energy.

14. The magnetic junction of claim 11 further comprising:
- an additional spacer layer, the free layer residing between the nonmagnetic spacer layer and the additional nonmagnetic spacer layer;
- an additional pinned layer, the additional spacer layer being between the free layer and the additional pinned layer, the additional pinned layer having an additional pinned layer magnetization substantially in plane.

15. A magnetic memory comprising:
- a plurality of magnetic storage cells, each of the plurality of magnetic storage cells including at least one magnetic junction, the at least one magnetic junction including a first pinned layer, a first nonmagnetic spacer layer, and a free layer, the first pinned layer having a first pinned layer magnetization, the first pinned layer magnetization being substantially in-plane, the free layer having an easy axis and a free layer magnetic moment, the nonmagnetic spacer layer residing between the pinned layer and the free layer, the at least one magnetic junction being configured such that the free layer is switchable between a plurality of stable magnetic states when a write current is passed through the magnetic junction and such that the free layer employs switching based on precession of the free layer magnetic moment around the easy axis of the free layer; and
- a plurality of bit lines.

16. A magnetic memory comprising:
- a plurality of magnetic storage cells, each of the plurality of magnetic storage cells including at least one magnetic junction, the at least one magnetic junction including a first pinned layer, a first nonmagnetic spacer layer, and a free layer, the first pinned layer having a first pinned layer magnetization, the first pinned layer magnetization being substantially in-plane, the free layer having an easy axis, the nonmagnetic spacer layer residing between the pinned layer and the free layer, the at least one magnetic junction being configured such that the free layer is switchable between a plurality of stable magnetic states when a write current is passed through the magnetic junction and such that the free layer employs precessional switching, wherein each of the plurality of magnetic memory cells further includes a second nonmagnetic spacer layer, a second pinned layer, and a bias structure, the free layer residing between the first nonmagnetic spacer layer and the second nonmagnetic spacer layer, the second pinned layer having a second pinned layer magnetization, the second pinned layer magnetization being substantially perpendicular to plane, the second spacer layer residing between the second pinned layer and free layer, the bias structure providing a magnetic bias at the free layer, the bias structure having a magnetic portion substantially exchange decoupled from the second pinned layer, the magnetic bias being substantially in-plane and perpendicular to the easy axis of the free layer; and a plurality of bit lines.

17. A magnetic memory comprising:

a plurality of magnetic storage cells, each of the plurality of magnetic storage cells including at least one magnetic junction, the at least one magnetic junction including a first pinned layer, a first nonmagnetic spacer layer, and a free layer, the first pinned layer having a first pinned layer magnetization, the first pinned layer magnetization being substantially in-plane, the free layer having an easy axis, the nonmagnetic spacer layer residing between the pinned layer and the free layer, the at least one magnetic junction being configured such that the free layer is switchable between a plurality of stable magnetic states when a write current is passed through the magnetic junction and such that the free layer employs precessional switching, wherein the first pinned layer has a center, a first edge, and a second edge, the first nonmagnetic spacer layer residing between the free layer and the first pinned layer, the first pinned layer magnetization varying across the first pinned layer such that the first pinned layer magnetization is substantially perpendicular-to-plane at at least the first edge and the second edge and is substantially in plane at the center; and a plurality of bit lines.

18. A method for providing a magnetic junction for use in a magnetic device comprising:

providing a first pinned layer having a first pinned layer magnetization;

providing a first nonmagnetic spacer layer; and providing a free layer having an easy axis and a free layer magnetization, the first nonmagnetic spacer layer residing between the first pinned layer and the free layer, wherein the magnetic junction is configured such that the free layer is switchable between a plurality of stable magnetic states when a write current is passed through the magnetic junction and such that the free layer employs switching based on precession of the free layer magnetic moment around the easy axis of the free layer.

19. A method for providing a magnetic junction for use in a magnetic device comprising:

providing a first pinned layer having a first pinned layer magnetization;

providing a first nonmagnetic spacer layer; and providing a free layer having an easy axis, the first nonmagnetic spacer layer residing between the first pinned layer and the free layer;

wherein the magnetic junction is configured such that the free layer is switchable between a plurality of stable magnetic states when a write current is passed through the magnetic junction and such that the free layer employs precessional switching wherein the first pinned layer has a first pinned layer magnetization, the first pinned layer magnetization being substantially in-plane and wherein the method further includes:

providing a second nonmagnetic spacer layer, the free layer residing between the first nonmagnetic spacer layer and the second nonmagnetic spacer layer;

providing a second pinned layer having a second pinned layer magnetization, the second pinned layer magnetization being substantially perpendicular to plane;

providing a bias structure for providing a magnetic bias at the free layer, the bias structure having a magnetic portion substantially exchange decoupled from the second pinned layer, the magnetic bias being substantially perpendicular to the easy axis of the free layer.

20. The method of claim 19 wherein the step of providing the first pinned layer further includes:

providing the first pinned layer having a center, a first edge, and a second edge, the nonmagnetic spacer layer residing between the free layer and the pinned layer, the first pinned layer magnetization varying across the first pinned layer such that the first pinned layer magnetization is substantially perpendicular-to-plane at at least the first edge and the second edge and is substantially in plane at the center.

\* \* \* \* \*

UNITED STATES PATENT AND TRADEMARK OFFICE
CERTIFICATE OF CORRECTION

| | | |
|---|---|---|
| PATENT NO. | : 9,142,758 B2 | Page 1 of 1 |
| APPLICATION NO. | : 13/495830 | |
| DATED | : September 22, 2015 | |
| INVENTOR(S) | : Apalkov et al. | |

It is certified that error appears in the above-identified patent and that said Letters Patent is hereby corrected as shown below:

In the specification

Please insert the following paragraph before the first paragraph in column 1, line 13:

--GOVERNMENT RIGHTS
This invention was made with U.S. Government support under Grant/Contract No. HR0011-09-C-0023 awarded by DARPA. The U.S. Government retains certain rights in this invention. Distribution authorized to U.S. Government Agencies only.--

Signed and Sealed this
Twenty-first Day of June, 2016

Michelle K. Lee
*Director of the United States Patent and Trademark Office*